(12) United States Patent
Laubenstein et al.

(10) Patent No.: US 6,546,346 B1
(45) Date of Patent: Apr. 8, 2003

(54) METHOD FOR DETERMINING THE RESONANCE FREQUENCY OF AN ELECTRIC RESONANT CIRCUIT

(75) Inventors: Rüdiger Laubenstein, Eningen (DE); Ulrich Exner, Reutlingen (DE); Ernst Damerau, Pfullingen (DE); Robert Kern, Buehlertal (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/367,026

(22) Filed: Sep. 24, 1999

(30) Foreign Application Priority Data

Feb. 8, 1997 (DE) .......................................... 197 04 765
Feb. 4, 1998 (DE) .......................................... 198 04 309

(51) Int. Cl.[7] .............................................. G01R 23/00
(52) U.S. Cl. ......................................... 702/75; 315/246
(58) Field of Search ............................. 702/75, 76, 83, 702/106, 189; 315/246, 106, 307

(56) References Cited

U.S. PATENT DOCUMENTS 3,922,582 A * 11/1975 Pitel ............................ 315/106
5,623,188 A * 4/1997 Bildgen ....................... 315/307
5,828,185 A * 10/1998 Fellows et al. .............. 315/246

FOREIGN PATENT DOCUMENTS

| EP | 0 271 396 | 6/1988 |
| EP | 0 413 991 | 2/1991 |
| EP | 0 744 883 | 11/1996 |

OTHER PUBLICATIONS

Mizuno et al. "High Frequency Operation of Metal–Halide Lamp Controlled by Microcomputer" Journal of Illuminating Engineering of Japan, vol. 71, No. 10 pp. 622–625 (Oct. 1987).

* cited by examiner

Primary Examiner—Marc S. Hoff
Assistant Examiner—Mohamed Charioui
(74) Attorney, Agent, or Firm—Kenyon & Kenyon

(57) ABSTRACT

A method for detecting the resonance frequency of an electrical oscillation circuit, in particular that of a starter oscillation circuit for high-pressure gas discharge lamps, is described in which the oscillation circuit is excited with various frequencies. The frequency search is undertaken in a search run with individual search attempts. A specific, fixed frequency is used for the sampling tests. Each fixed frequency is selected and used according to a specific search pattern. In the search pattern, the first sampling test is carried out with the mean frequency, which is the mean between the minimum and maximum possible resonance frequencies. In each of the subsequent sampling tests, the test frequency is modified in steps. The resonance frequency found in a search run can be stored as a learning frequency for use as a starting frequency for subsequent search runs and updated as necessary.

16 Claims, 3 Drawing Sheets

METHOD FOR DETERMINING THE RESONANCE FREQUENCY OF AN ELECTRIC RESONANT CIRCUIT

BACKGROUND INFORMATION

The present invention relate to a method for detecting the resonance frequency of an electrical oscillation circuit, for example of a starter oscillation circuit for high-pressure gas discharge lamps.

In a method of this type known from European Published Patent Application 271 369, the resonance frequency during the starting process of a gas discharge lamp is determined by frequency sweep. In so doing, a frequency ramp is continuously run through from a minimum value to a maximum one and back again. At each passage through the resonance frequency, the oscillation circuit is excited for a brief time. A different method provides for passage through a frequency ramp. When the resonance frequency is reached, the oscillation circuit begins to oscillate. An additional possibility is to provide for a design of a self-oscillating circuit in which the resonance circuit itself sets the oscillating frequency.

The disadvantage of all of these known methods is that they do not operate satisfactorily in all respects and/or are quite expensive and require the costly use of special components.

SUMMARY OF THE INVENTION

In contrast, the advantage of the method according to the present invention for detecting the resonance frequency of an electrical oscillation circuit that it makes it possible to detect or determine and find the resonance frequency, subject to tolerance, of an electrical oscillation circuit to be triggered in a short time and at low expense.

According to the underlying concept of the present invention, the frequency search is undertaken in a search run with individual sampling tests, a specific, fixed frequency is used in the sampling tests, and each fixed frequency is selected and used according to a specified search pattern.

The present invention makes a purely controlled, time-optimized search method available which eliminates the need for a self-oscillating circuit, which is difficult to implement, especially in the very high frequency range. Moreover, it is not even necessary to recognize whether movement is toward or away from the actual resonance frequency during the search. Such recognition would otherwise have to be made via phase detection, which is associated with greater hardware expense. If a microcontroller is provided in the control unit containing the electrical oscillation circuit, which may very often be the case today, then the otherwise necessary hardware circuits can be eliminated and replaced by software functions which are carried out by the microcontroller.

According to a particularly advantageous further development of the present invention, the first sampling test in the search pattern is carried out at the mean frequency $f_{mitt}$, the mean frequency $f_{mitt}$ being the mean of the minimum $f_{min}$, and maximum $f_{max}$ possible resonance frequency.

According to a particularly advantageous embodiment of the method according to the present invention, the frequency range is divided into equidistant steps $\Delta f$ between the minimum $f_{min}$ and maximum $f_{max}$ possible resonance frequency, and the number of steps is selected taking the frequency range to bandwidth ratio of the oscillation circuit into account.

In a particularly suitable further development of this embodiment of the method according to the present invention, the second sampling test is undertaken at the fixed frequency $f_{mitt}+\Delta f$ and the third sampling test at the fixed frequency $f_{mitt}-\Delta f$, or also vice versa.

According to an additional particularly advantageous embodiment of the present invention, the method provides that the additional sampling tests are carried out at test frequencies $f_{mitt}+2\Delta f$, $f_{mitt}-2\Delta f$;

$f_{mitt}+3\Delta f$, $f_{mitt}-3\Delta f$;

$f_{mitt}+4\Delta f$, $f_{mitt}-4\Delta f$;

$f_{mitt}+5\Delta f$, $f_{mitt}-5\Delta f$, etc.

According to an additional very suitable embodiment of the present invention, the resonance frequency $f_{res}$ determined in a search run is stored in memory and, as a quasi-learning frequency $f_{lern}$, is available as a starting frequency for a subsequent search run. In the next search operation, for example, after the control unit containing the oscillation circuit is switched off and on, the search operation does not start with $f_{mitt}$ but rather with the previously learned and stored value $f_{lern}$.

According to a particularly advantageous further development of this embodiment of the present invention, learning frequency $f_{lern}$, is stored in a non-volatile memory. In a further embodiment, learning frequency $f_{lern}$ may additionally be stored in an EEPROM cell of a microcontroller, it being possible to store learning frequency $f_{lern}$ as a control voltage for a voltage-controlled oscillator. It is particularly advantageous to store the frequency value determined in the most recent search run each time.

In a further improvement of these embodiments of the method according to the present invention, resonance frequency $f_{res}$ which is determined in a search run is only stored once again as learning frequency $f_{lern}$ if the interval between the old stored value and the newly determined value exceeds a specified amount. This can bring about a reduction of the number of the newly stored values. This is particularly advantageous if the number of the starting operations of the control unit in which the oscillation circuit is installed is greater than the number of the maximum allowable number of write cycles of the non-volatile data memory.

According to a different advantageous further development of the method according to the present invention, if the limits defined by the minimum $f_{min}$ and maximum $f_{max}$ possible resonance frequency are reached during a search run, the subsequent search is only carried out in the direction of the respective other limit.

A further suitable embodiment of the method according to the present invention provides that after a completed unsuccessful search run, it is repeated and started again with the stored learning frequency $f_{lern}$, if necessary. This embodiment is of particular benefit in those applications in which the detection of resonance frequency $f_{res}$ is evaluated according to whether a desired sparkover has taken place when the electrical oscillation circuit begins to oscillate, for example, in a high-pressure gas discharge lamp to be ignited and in which sparkover and consequently ignition does not take place in the first attempt by the occasional occurrence of high sparkover voltages in spite of a precisely detected resonance frequency $f_{res}$.

A further advantageous modification of the method according to the present invention provides that the search is initially not run completely but rather only in a limited search range, in particular from learning frequency $f_{lern} \pm n^* \Delta f$, n being selected so that the typically occurring drift of the resonance frequency is located within the selected search range. A useful further development of this modification provides that if the success criterion is not found within the limited search range, the search is initially carried out a few more times only in the limited search range before the search is extended, if necessary, to the entire search range. This is also of particular advantage in this case if the number of starting operations of the control unit in which the oscillation circuit is located is greater than the number of the maximum allowed write cycles of the non-volatile data memory. According to a particularly suitable embodiment of this further development, the limited search range can be extended step-by-step to the maximum search range after each unsuccessful search series.

DETAILED DESCRIPTION

Figure 1:
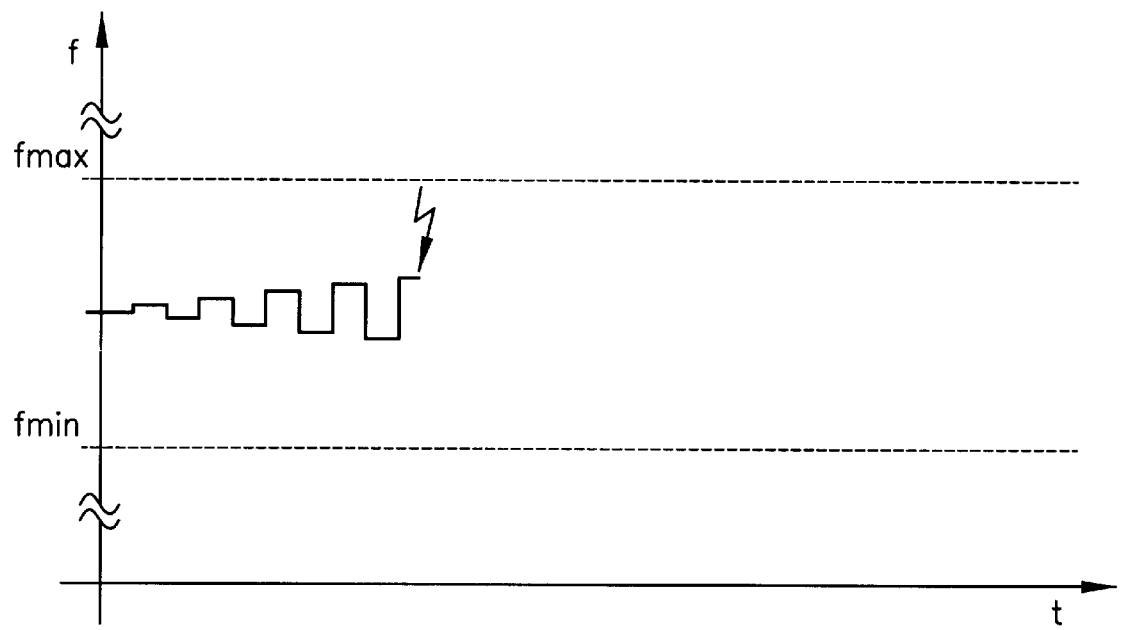
FIG. 1 shows a diagram of the search frequencies over time according to the basic method of the present invention in which frequency $f_{mitt}$ is used as the starting point.

The search frequencies over time according to the basic method of the present invention are shown in a diagram in FIG. 1. In the method according to the present invention, according to the underlying idea, the frequency search is undertaken in a search run with individual sampling tests. In the sampling tests, a specific, fixed frequency is used in each case and each fixed frequency is selected according to a specific search pattern and is used according to a specific pattern. The very first search run to detect the resonance frequency of the electrical oscillation circuit is started with mean frequency $f_{mitt}$. Mean frequency $f_{mitt}$ is defined as that frequency which lies at the middle between the minimum ($f_{min}$) and maximum ($f_{max}$) possible resonance frequency, thus forming the mean of these two limiting values. Corresponding to the search pattern applied, the first sampling test is initially carried out with mean frequency ($f_{mitt}$) The next sampling test takes place at a different specific and fixed frequency which differs from the first by a discrete value $\Delta f$.

According to a variant of the method according to the present invention, the frequency range is divided into equidistant steps $\Delta f$ between the minimum $f_{min}$ and maximum $f_{max}$ possible resonance frequency. The number of intervals is selected in consideration of the frequency range to bandwidth ratio of the oscillation circuit; it is thus geared to this ratio. The interval thus determined between two adjacent search or test frequencies is described as $\Delta f$.

In the method according to the present invention, the second sampling test is undertaken at fixed frequency $f_{mitt}+\Delta f$, the third at fixed frequency $f_{mitt}-\Delta f$, or also vice versa. The further sampling tests are undertaken at the test frequencies $f_{mitt}+2\Delta f$, $f_{mitt}-2\Delta f$;

$f_{mitt}+3\Delta f$, $f_{mitt}-3\Delta f$;

$f_{mitt}+4\Delta f$, $f_{mitt}-4\Delta f$;

$f_{mitt}+5\Delta f$, $f_{mitt}-5\Delta f$, etc.

This is continued until resonance frequency $f_{res}$ is found or until the fulfillment event occurring at resonance frequency $f_{res}$, the sparkover and the ignition of a gas discharge lamp, for example, takes place. This is shown in each of the figures by the zigzag arrow. It thus takes place, for example, after the $10^{th}$ sampling test in the case shown in FIG. 1.

Figure 2:
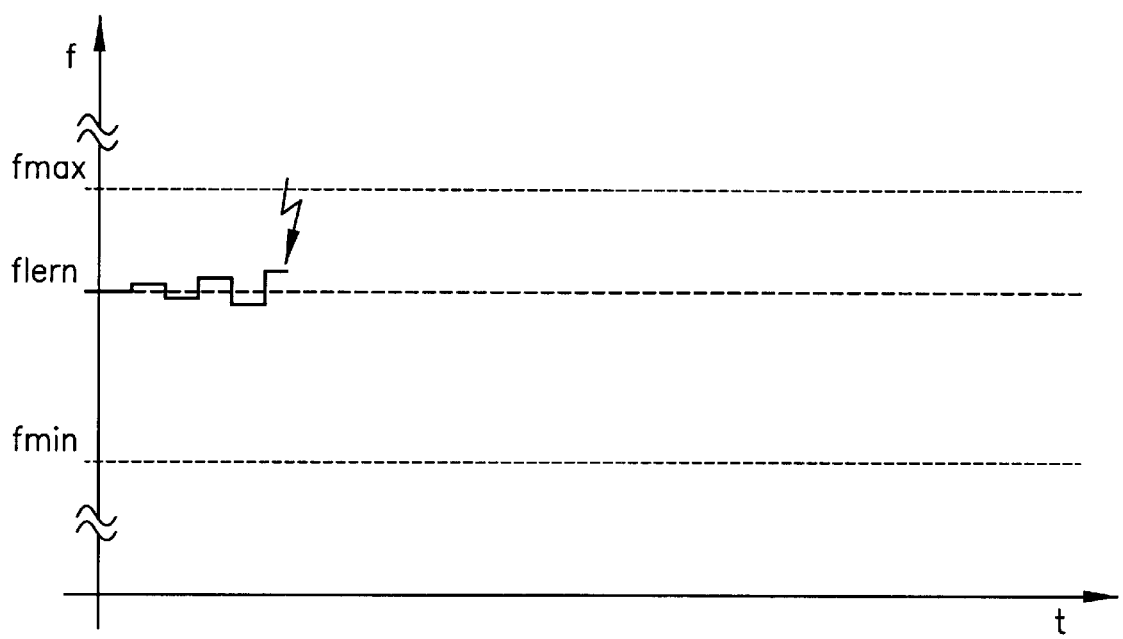
FIG. 2 shows a diagram of the search frequencies over time similar to that in FIG. 1 in which a stored learning frequency $f_{lern}$ is used as the starting point.

According to a special embodiment of the present invention which makes it possible to detect resonance frequency $f_{res}$ in a particularly fast and reliable manner in practical operation, the resonance frequency $f_{res}$ determined in a search run is stored in memory. As a quasi-learning frequency $f_{lern}$, it is thus available in a subsequent search run as the starting frequency for this search run. This case is shown in the diagram according to FIG. 2. Learning frequency $f_{lern}$ differs from mean frequency $f_{mitt}$, on which the example according to FIG. 1 is based. In the next search operation, for example, after the control unit containing the oscillation circuit is switched off and on, the search operation does not start at $f_{mitt}$ but rather at the previously learned and stored value $f_{lern}$. As shown in the diagram of FIG. 2, resonance frequency $f_{res}$ or the fulfillment event is already found or attained after the $5^{th}$ sampling test as a result.

The storage of learning frequency $f_{lern}$ takes place in a suitable manner in a non-volatile memory, In a further embodiment, the storage of learning frequency $f_{lern}$ may also take place in an EEPROM cell of a microcontroller. Learning frequency $f_{lern}$ is stored there as a control voltage for a voltage-controlled oscillator, a VCO. It is particularly advantageous to store the frequency value determined in the most recent search run each time.

In many cases, it is of particular advantage to store the resonance frequency $f_{res}$ determined in a search once again as learning frequency $f_{lern}$ only if the interval between the old stored value and the newly determined value exceeds a specified amount. This can reduce the number of newly stored values. This is important in particular when the number of starting operations of the control unit in which the oscillation circuit is installed is greater than the number of the maximum allowable write cycles of the non-volatile data memory.

Figure 3:
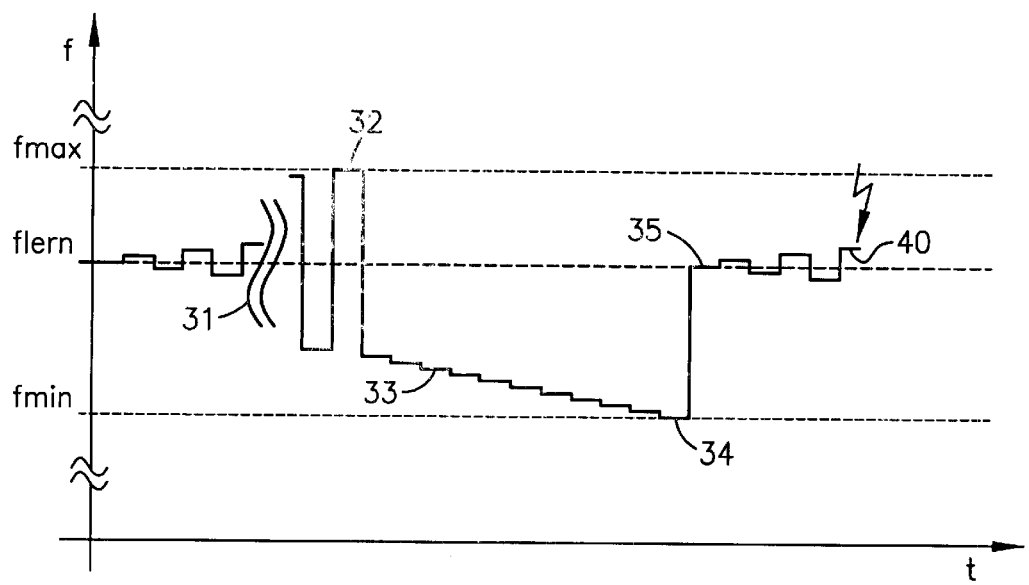
FIG. 3 shows a diagram of the search frequencies over time according to a modified embodiment of the method of the present invention in which a different search strategy is used in continuation after an unsuccessful search operation.

FIG. 3 shows an additional possible embodiment of the method according to the present invention. In the search operation, limits $f_{min}$ and $f_{max}$ of the search range may be reached without resonance frequency $f_{res}$ being found or the fulfillment event occurring. If this is the case, as is shown in FIG. 3 by serpentine lines 31 and maximum frequency $f_{max}$ is reached at 32, then the subsequent search is only carried out in the direction of the respective other limit. This is suggested in FIG. 3 by steps 33, i.e., with each new sampling test, the search frequency is reduced one step until the limit $f_{min}$ is reached. Upon reaching one of the limits given by the minimum $f_{min}$ and maximum $f_{max}$ possible resonance frequency during a search run, the search direction is thus reversed and the search is continued in only one direction. FIG. 3 shows an additional option offered by the method according to the invention. If a limit, for example, $f_{min}$, is reached at step 34, then the entire search can be repeated from the start. The subsequent search operation starts the sampling test with step 35 at learning frequency $f_{lern}$ then runs through the normal basic pattern shown in FIG. 1 and ends at 40 with detection of the resonance frequency. After a completed unsuccessful search run, repeating it and starting again if necessary at stored learning frequency $f_{lern}$ is of particular value in those applications in which the detection of resonance frequency $f_{res}$ is evaluated according to whether a desired sparkover takes place when the electrical oscillation circuit starts to oscillate, for example, in a high-pressure gas discharge lamp to be ignited and in which sparkover and consequently ignition does not take place at the first attempt by the occasional occurrence of high sparkover voltages in spite of a precisely detected resonance frequency $f_{res}$.

Figure 4:
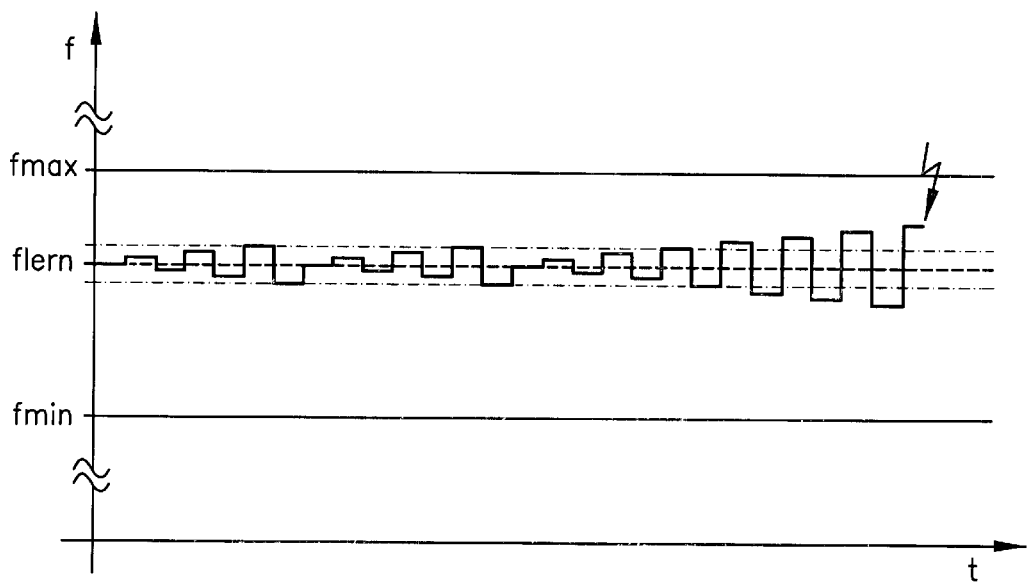
FIG. 4 shows a diagram of the search frequencies over time according to a further modification of the method of the present invention with a search strategy in which the search range is initially limited.

An additional advantageous modification of the present invention provides that the search is initially not run completely but rather is carried out in a limited search range as shown in FIG. 4. In this example, seven sampling tests are carried out starting from learning frequency $f_{lern}$, in 3 steps each below and above the learning frequency. In general, learning frequency $f_{lern} \pm n^*\Delta f$ is used as the starting point, n being selected so that the typically occurring drift of the resonance frequency is within the selected search range. An advantageous further development of this modification provides that if the success criterion is not found within the limited search range, then the search is initially continued a few times more only in the limited search range before the search is, if necessary, extended to the entire search range as is initiated after the third iteration in the example shown. This is also of particular advantage in this case if the number of starting operations of the control unit in which the oscillation circuit is installed is greater than the number of the maximum allowable number of write cycles of the non-volatile data memory.

Figure 5:
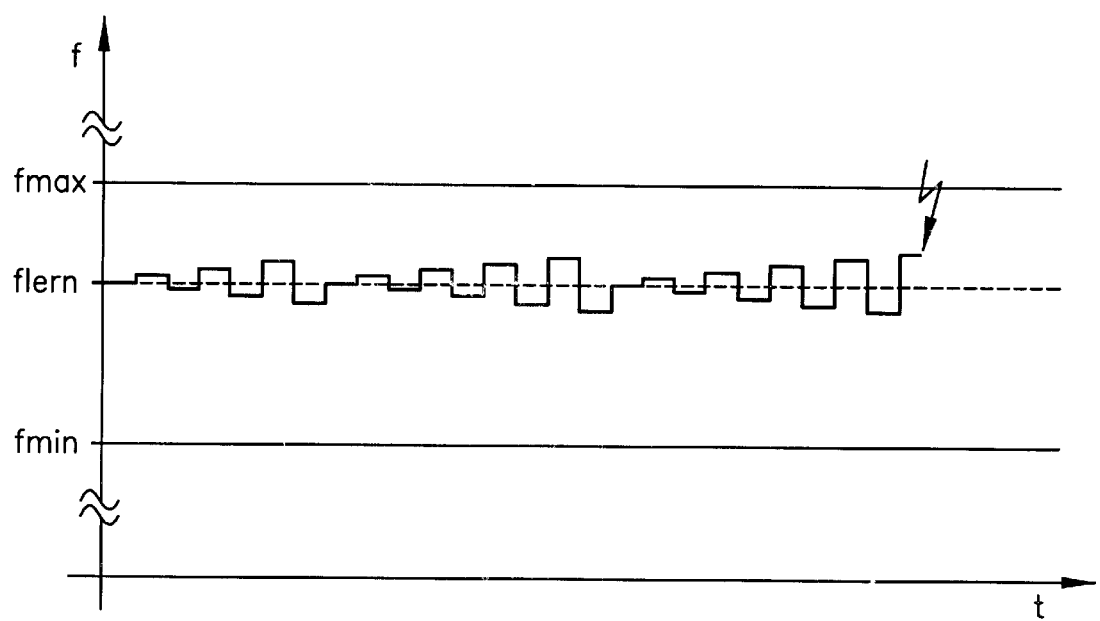
FIG. 5 shows a diagram of the search frequencies over time similar to that in FIG. 4 in which the limited search range is gradually extended.

According to an especially advantageous design of this embodiment of the method of the present invention just described, a further development is shown in FIG. 5. After each unsuccessful search series, the limited search range is extended step-by-step to the maximum search range until the fulfillment event occurs. In the example shown, two futile series of attempts in the limited search range and a complete search run according to the basic idea of the present invention are shown.

The method according to the present invention can be implernented in software functions very flexibly and very easily if the control unit in which the electrical oscillating frequency is used is equipped with a microcontroller, which is frequently and increasingly the case today. This makes expensive hardware implernentations unnecessary.

What is claimed is:

1. A method for detecting a resonance frequency of an electrical starter ocillation circuit for a high-pressure gas discharge lamp, the oscillation circuit being excited in accordance with a plurality of frequencies, the method comprising the steps of:
    performing a frequency search in a search run according to a plurality of individual sampling tests;
    selecting a plurality of specific, fixed frequencies in accordance with a specific search pattern;
    using one of the plurality of specific, fixed frequencies for each of the plurality of individual sampling tests; and
    in the search pattern, performing a first one of the plurality of individual sampling tests in accordance with a mean frequency $f_{mitt}$, the mean frequency $f_{mitt}$ corresponding to a mean between a minimum possible resonance frequency $f_{min}$ and a maximum possible resonance frequency $f_{max}$.

2. The method according to claim 1, further comprising the steps of:
    selecting an amount of equidistant steps $\Delta f$ for a frequency range by taking into account a ratio of the frequency range to a bandwidth of the oscillation circuit; and
    subdividing the frequency range into the equidistant steps $\Delta f$ between the minimum possible resonance frequency $f_{min}$ and the maximum possible resonance frequency $f_{max}$.

3. The method according to claim 2, further comprising the steps of:
    determining a resonance frequency $f_{res}$ in the search run;
    storing the resonance frequency $f_{res}$ in a memory; and
    using as a starting frequency for a subsequent search run the resonance frequency $f_{res}$ in the form of a quasi-learning frequency $f_{lern}$.

4. The method according to claim 3, wherein:
    the search run is initially run only in a limited search range from learning frequency $(f_{lern}) \pm n^*\Delta f$, and
    n is selected so that a drift of the resonance frequency is located within the limited search range.

5. The method according to claim 4, wherein, if a success criterion is not found within the limited search range, the method further comprises the step of:
    performing the search run a plurality of more times only in the limited search range before the search run is extended to an entire search range.

6. The method according to claim 5, wherein, after each unsuccessful search run, the limited search range is extendable in a step-by-step manner to a maximum search range.

7. The method according to claim 3, further comprising the step of:
    storing the learning frequency $f_{lern}$ in a non-volatile memory.

8. The method according to claim 7, wherein when the search run is completed as unsuccessful, the search run is repeated and started again with the stored learning frequency $f_{lern}$.

9. The method according to claim 3, further comprising the step of:
    storing the learning frequency $f_{lern}$ in an EEPROM cell of a microcontroller as a control voltage for a voltage-controlled oscillator.

10. The method according to claim 3, further comprising the step of:
    storing the resonance frequency $f_{res}$ again only as the learning frequency $f_{lern}$ if an interval between an old stored value and a newly determined value exceeds a specific amount.

11. The method as recited in claim 1, further comprising:
    providing a trigger voltage which is greater than an operating supply voltage;
    performing the frequency search at a voltage lying below the trigger voltage;
    measuring a current in a resonant circuit and determining a maximum level of the measured current; and
    ascertaining a resonant frequency at the maximum current.

12. The method as recited in claim 11, wherein the voltage lying below the trigger voltage, at which the frequency search is carried out, is the operating supply voltage without the application of the trigger voltage.

13. The method as recited in claim 11, wherein a battery voltage of a motor vehicle is used as the operating supply voltage.

14. The method according to claim 1, further comprising the step of performing one of the steps of:
   performing a second one of the plurality of individual sampling tests at a fixed frequency $f_{mitt}+\Delta f$ and performing a third one of the plurality of individual sampling tests at a fixed frequency $f_{mitt}-\Delta f$, and
   performing the second one of the plurality of individual sampling tests at the fixed frequency $f_{mitt}-\Delta f$ and performing the third one of the plurality of individual sampling tests at the fixed frequency $f_{mitt}+\Delta f$.

15. The method according to claim 14, further comprising the step of: performing a plurality of further sampling tests at least the test frequencies of $f_{mitt}+2\Delta f$, $f_{mitt}-2\Delta f$, $f_{mitt}+3\Delta f$, $f_{mitt}-3\Delta f$;

$f_{mitt}+4\Delta f$, $f_{mitt}-4\Delta f$, and $f_{mitt}+5\Delta f$, $f_{mitt}-5\Delta f$.

16. The method according to claim 1, wherein, if limits defined by the minimum possible resonance frequency $f_{min}$ and the maximum possible resonance frequency $f_{max}$ are reached during the search run, the method further comprises the step of:
   performing a subsequent search only in a direction of a respective other limit.

* * * * *

UNITED STATES PATENT AND TRADEMARK OFFICE
CERTIFICATE OF CORRECTION

PATENT NO.    : 6,546,346 B1
DATED         : April 8, 2003
INVENTOR(S)   : Rüdiger Laubenstein et al.

It is certified that error appears in the above-identified patent and that said Letters Patent is hereby corrected as shown below:

<u>Column 1,</u>
Line 7, change "relate" to -- relates --.
Line 12, after "Application" insert -- No. --.
Line 32, change "circuit that" to -- circuit is that --.

Signed and Sealed this

Twenty-seventh Day of April, 2004

JON W. DUDAS
*Acting Director of the United States Patent and Trademark Office*